(12) United States Patent
Essink

(10) Patent No.: US 6,346,850 B2
(45) Date of Patent: Feb. 12, 2002

(54) POLYPHASE FILTER

(75) Inventor: Berend Hendrik Essink, Enschede (NL)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/741,014

(22) Filed: Dec. 21, 2000

(30) Foreign Application Priority Data

Dec. 24, 1999 (NL) ............................................. 1013951

(51) Int. Cl.[7] ................................................ H03K 5/00
(52) U.S. Cl. ...................................... 327/552; 455/313
(58) Field of Search .................................. 327/551, 552, 327/555, 556, 557, 558; 455/313

(56) References Cited

U.S. PATENT DOCUMENTS

| | | | | |
|---|---|---|---|---|
| 4,914,408 A | | 4/1990 | Voorman | 327/552 |
| 5,764,171 A | * | 6/1998 | Stivoort | 341/143 |
| 6,035,186 A | * | 3/2000 | Moore et al. | 455/313 |

OTHER PUBLICATIONS de Heij, W.J.A. et al.: "Transconductor and Integrator Circuits for Integrated Bipolar Video Frequency Filters". Proceedings of the International Symposium on Circuits and Systems, US, New York, IEEE, deel SYMP. 22, May 8, 1989. Pp. 114–117. XP000131576.

Crols, J. et al.: "An Analog Intergrated Polyphase Filter for a High Performance Low–IF Receiver". Symposium on VLSI Circuits, US, New York, IEEE, Jun. 8, 1995, pp. 87–88. XP000557814.

* cited by examiner

Primary Examiner—Dinh T. Le
(74) Attorney, Agent, or Firm—Burns, Doane, Swecker & Mathis, L.L.P.

(57) ABSTRACT

A polyphase filter ($20$; $100$) is described having two filter channels ($30_I$, $30_Q$; $101_I$, $101_q$) for processing an I-input signal ($\phi_I$) and a Q-input signal ($\phi_Q$) which is shifted over 90° with respect to the I-input signal ($\phi_I$), respectively. The filter ($20$; $100$) has at least two capacitive filter components ($C_I$, $C_Q$; $Ci_I$, $Ci_Q$) corresponding to each other in the two filter channels ($30_I$, $30_Q$; $101_I$, $101_Q$), wherein the capacity values ($C$; $Ci$) of these two capacitive filter components ($C_I$, $C_Q$; $Ci_I$, $Ci_Q$) are substantially equal to each other. Said two capacitive filter components ($C_I$, $C_Q$; $Ci_I$, $Ci_Q$) are coupled to each other by means of two current source couplings ($40_{QI}$, $40_{IQ}$; $106i$) switched in anti-parallel, having substantially equal characteristic. Hereby, a displacement of the filter characteristic toward higher frequencies is achieved, over a distance $\Omega_c$.

7 Claims, 5 Drawing Sheets

POLYPHASE FILTER

The present invention relates in general to a polyphase bandpass filter.

Such filters are known per se, for instance from the U.S. Pat. No. 4,914,408, and they can for instance be applied in receiver circuits for, e.g. radio applications, television applications, or telephone applications. Although such filters also know different applications, a possible application of such a filter will be explained here in more detail in the context of a receiver circuit.

An important drawback of the filter described in U.S. Pat. No. 4,914,408 is that a coupling between two filter channels is effected by means of resistors. An important aim of the present invention is therefore to provide a polyphase bandpass filter wherein such coupling resistors are omitted.

These and other aspects, characteristics and advantages of the present invention will be explained in more detail by the following description of a preferred embodiment of a polyphase bandpass filter according to the invention with reference to the drawings, in which same reference numerals indicate same or similar parts, and in which:

FIG. 1 schematically shows a known receiver circuit.

FIG. 2A schematically illustrates the transmission characteristic of a low pass filter.

FIG. 2B schematically illustrates the transmission characteristic of a bandpass filter, derived from the transmission characteristic of FIG. 2A.

FIG. 2C schematically shows a parallel connection of a capacitor and a complex component.

FIG. 2D schematically illustrates a known way of coupling two filter channels.

Figure 1:
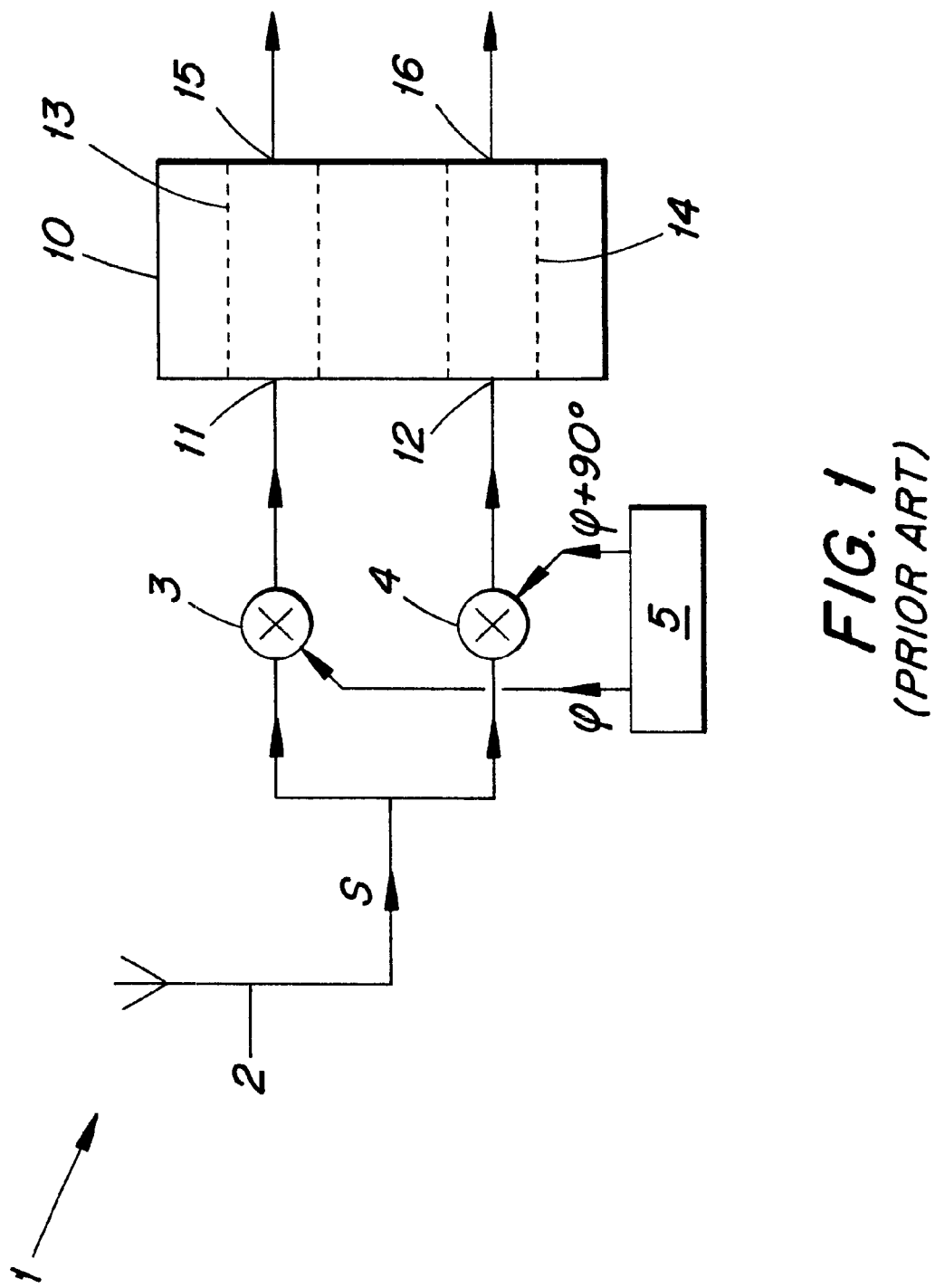

FIG. 1 schematically shows a known receiver circuit 1, in which a receiver signal S coming from an antenna 2 is mixed in a first mixing stage 3 with a signal $\phi$ provided by a local oscillator 5, and wherein said signal S is mixed in a second mixing stage 4 with a second signal provided by the local oscillator 5 which is 90° shifted with respect to the first signal $\phi$. The output signal of the first mixing stage 3, which is also indicated by the phrase inphase signal, is fed to a first input 11 of a filter 10, and the output signal of the second mixing stage 4, which is also indicated by the phase quadrature signal, is fed to a second input 12 of the filter 10. The filter 10 has two filter channels 13 and 14, respectively, which process the inphase signal of the first input 11 and the quadrature signal of the second input 12, respectively, in substantially identical ways, and which have outputs 15 and 16, respectively, for providing an inphase output signal and a quadrature output signal, respectively, wherein the quadrature output signal of the second output is shifted 90° with respect to the inphase output signal of the first output. The filter channels 13 and 14 have mutual identical filter characteristics, for example a bandpass characteristic.

In the following, the frequency of the local oscillator signal will be indicated by $f_1$. In the receiver signal S, many frequencies are present; in the following, the tuning frequency to which the reception circuit 1 must be tuned will be indicated by $f_2$. Assume that this frequency is higher than the local frequency $f_1$, i.e. that $f_2 = f_1 + \Delta f$.

In general, when two signals having two different frequencies $f_1$ and $f_2$ are mixed, a signal component results with the difference frequency $\Delta f = f_2 - f_1$. However, in the receiver signal S there will also be a frequency $f_3$ present, fulfilling $f_3 = f_1 - \Delta f$. This component also contributes to the eventual mixing signal, i.e. by causing a virtual mirror signal component with the difference frequency $f_3 - f_1 = -\Delta f$. It is desired that the filter 10 suppresses such mirror signal components.

Further it is desired that the filter 10 has a bandpass characteristic which is substantially symmetrical with respect to the center frequency $\Omega_c$.

A known way of designing a bandpass filter of which the frequency characteristic is symmetrical with respect to a center frequency $\Omega_c > 0$, and wherein mirror signal components are effectively suppressed, starts with a lowpass filter of which the characteristic corresponds to the desired characteristic of the bandpass filter to be designed.

Figure 2A:
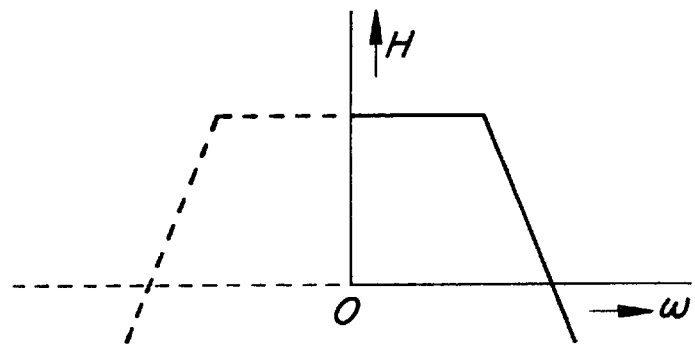

FIG. 2A schematically illustrates the transfer characteristic of a lowpass filter. Along the horizontal axis, the frequency $\Omega$ is set out, and the transfer function H is set out along the vertical axis. In practice, only signals can occur of which the frequency is higher than zero; this part of the frequency characteristic is shown with a solid line. The frequncy characteristic, however, does not depend on the sign of the frequency, which implies that the frequency characteristic is symetrical with respect to $\Omega = 0$, as is shown in FIG. 2A with a dotted line.

Figure 2B:
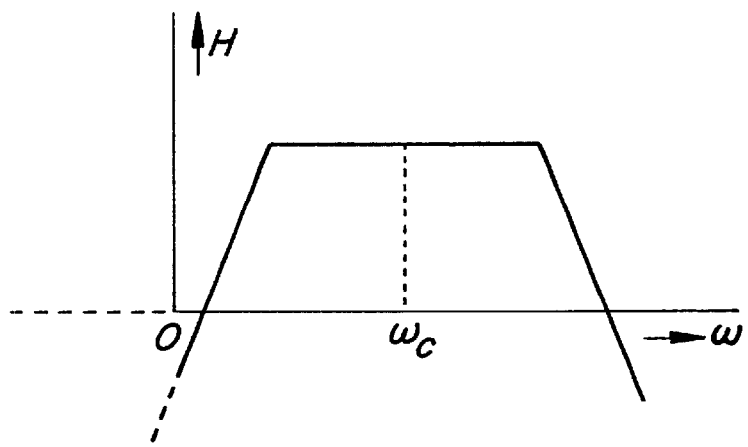

Depending on the design of the lowpass filter, said lowpass filter can have a desired characteristic, for instance first order, second order, or higher order, Bessel-type, Butterworth-type, etc. Starting from the lowpass filter with the desired characteristic, a bandpass filter can be derived by a transformation or shifting of the filter characteristics to a higher frequency. FIG. 2B shows the characteristic of FIG. 2A, shifted over a distance $\Omega_c$ to a higher frequency. The transfer function $H_{BDF}(\Omega)$ of this bandpass filter fulfills the following formula:

$$H_{BDF}(\Omega) = H_{LDF}(\Omega - \Omega_c) \tag{1}$$

The desired shift of the filter characteristic corresponds to a shift of all poles and all zeros of the filter over mutually identical distances along the imaginary axis. In a filter design of which the components with frequency-depending impedance are capacities exclusively, this can be achieved by switching a complex component X in parallel to said capacitive filter components, of which the admittance $Y_X$ is a constant complex number according to the formula $$Y_X(\Omega) = -j \cdot \Omega_c \cdot C \tag{2}$$

Figure 2C:
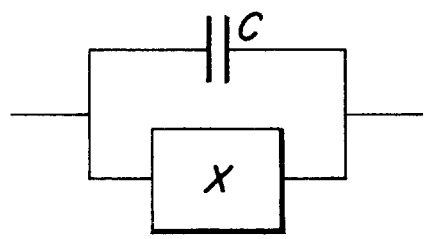

FIG. 2C schematically shows a parallel connection of a capacitor C and such a complex component X. For the frequency-depending admittance $Y_c$ of a capacitor with a capacitive value C, the following formula applies in the case of an ideal capacitor $$Y_c(\Omega) = j \cdot \Omega \cdot C \tag{3}$$

For the frequency-depending admittance Y of the parallel connection of FIG. 2C, the following is valid:

$$Y(\Omega) = Y_c(\Omega) + Y_X(\Omega) = j \cdot \Omega \cdot C - j \cdot \Omega_c \cdot C = j \cdot (\Omega - \Omega_c) \cdot C \tag{4}$$

In the case of a signal with frequency $\Omega$, the behaviour of this parallel circuit is, therefore, identical to the behaviour of the capacitor C at a frequency $\Omega - \Omega_c$. By replacing all capacitive filter components of a filter by such parallel circuits, the behaviour of the overall filter at a frequency $\Omega$ will therefore be identical to the behaviour of the original filter at a frequency $\Omega - \Omega_c$.

The above deduction already applies for a single filter. A problem when realizing a bandpass filter in this way, then, is moved to a problem of providing a component of which the admittance (or inversely: the impedance) is a constant complex number. Although this is possible per se, in a polyphase filter it is possible to use in an elegant way the fact that there are two mutually identical filter channels present, in which the signals are mutually identical but shifted over 90° with respect to each other. Then, in such a filter, the behaviour of the complex component X can be obtained by using, in each channel, a component of which the admittance is a real number, but which receives at its input the 90° shifted signal from the other channel.

Figure 2D:
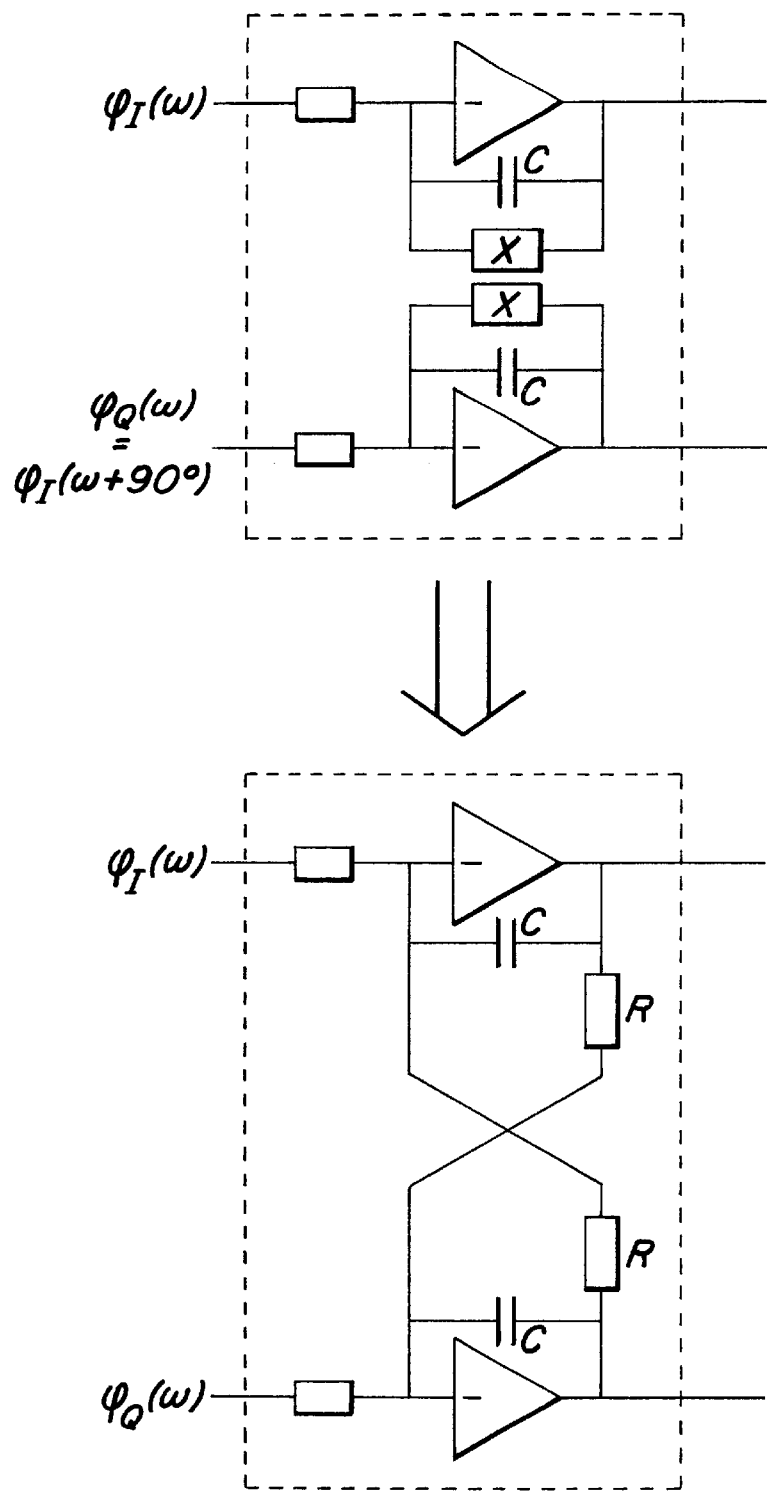

Such an approach for the construction of a polyphase bandpass filter has already been described in the U.S. Pat. No. 4,914,408. There, the real coupling between two filter channels is effected by means of resistors, as illustrated in FIG. 2D. Therein, each resistor has a resistance value $R=\Omega_c \cdot C$.

This known approach, however, has some objections, which are particularly relevant when realizing the filter on a chip. Caused by process variations, the resistors and capacitors of the filter will show a relatively large tolerance. Therefore, the capacitors and resistors should be able to be set after manufacture. However, this is difficult to realize.

It is a general goal of the present invention to overcome the mentioned disadvantages.

More particularly, the present invention aims to provide a polyphase bandpass filter wherein the coupling between two filter channels, necessary for achieving the desired frequency shift, is effected without resistors.

Figure 3A:
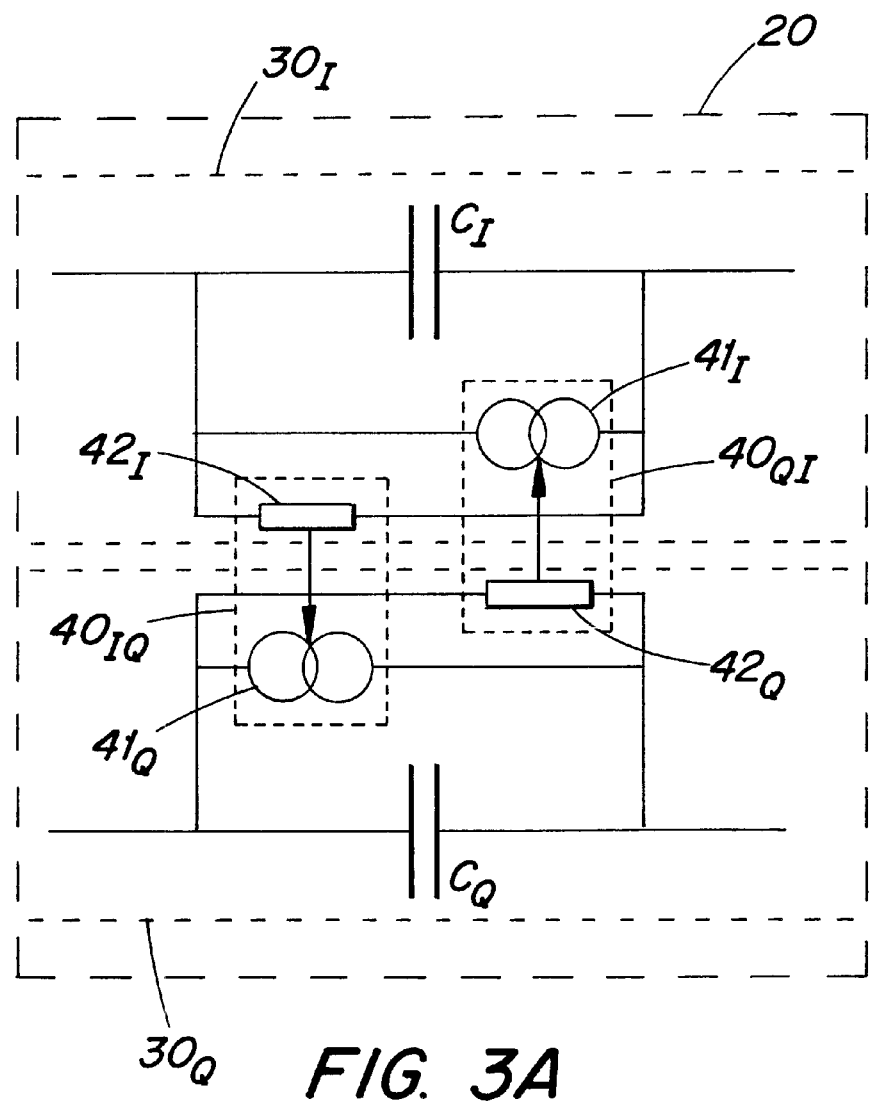
FIG. 3A illustrates the coupling principle according to the present invention.

According to an important aspect of the present invention, the coupling between two filter channels is effected by means of a voltage-controlled current source. This principle in accordance with the present invention is illustrated in FIG. 3A. In FIG. 3A, a polyphase filter is generally indicated by the reference numeral 20. The filter 20 has two mutually identical filter channels 30, which will be indicated with the index I and Q, respectively, for distinction with respect to each other. Each filter channel $30_I$, $30_Q$ has an input $31_I$, $31_Q$ and an output $32_I$, $32_Q$. Since the design of the filter channels $30_I$, $30_Q$ can be any suitable design, while various constructions for filter channels are known per se, the complete design of the filter channels 30 is not shown in FIG. 3A.

For the sake of the following discussion, one capacitive filter component $C_I$ of the inphase filter channel $30_I$ is shown in FIG. 3A, and the corresponding capacitive filter component $C_Q$ of the quadrature filter channel $30_I$ is shown. The two capacitive filter components $C_I$ and $C_Q$ are coupled with each other by means of two current source couplings $40_{QI}$ and $40_{IQ}$ comprises a first voltage-controlled current source $41_I$ of which the output is connected in parallel to the capacitive filter component $C_I$ in the inphase filter channel $30_I$, while the second current source coupling $40_{IQ}$ comprises a second voltage-controlled current source $41_Q$ of which the output is connected in parallel with the corresponding capacitive filter component $C_Q$ in the quadrature filter channel $30_Q$.

The first voltage-controlled current source $41_I$ is controlled by an output signal of a first voltage detector $42_Q$, of which the input is connected in parallel with the capacitive filter component $C_Q$. Similarly, the second voltage-controlled current source $41_Q$ is under control of a second voltage detector $42_I$ of which the input is connected in parallel with the capacitive filter component $C_I$.

Thus, the first voltage-controlled current source $41_I$ adds to the first filter channel $30_I$ a current of which the value depends on the voltage over the capacitive filter component $C_Q$ in the second filter channel $30_Q$, while the second voltage-controlled current source $41_Q$ adds to the second filter channel $30_Q$ a current of which the value depends on the voltage over the capacitive filter component $C_I$ in the first filter channel $30_I$.

The two current source coupling $40_{QI}$ and $40_{IQ}$ can be mutually identical, although this is not necessary. Important is only, that the proportionality factors between the voltage detected by the voltage detector 42 and the current generated by the current source 41 are mutually identical for both current source coupling $40_{QI}$ and $40_{IQ}$; in other words: important is only that the two current source couplings $40_{QI}$ and $40_{IQ}$ have mutually identical transfer characteristics. This implies that each current source coupling $40_{QI}$ and $40_{IQ}$ is designed for letting the voltage-controlled current source $41_I$ and $41_Q$, respectively, generate a current $I_{41,I}$ and $I_{41,Q}$, respectively, of which the current magnitude depends on the voltage $V_{CQ}$ and $V_{CI}$, respectively, detected by the voltage detector $42_Q$ and $42_I$, respectively, according to the formulas $$I_{41,I}=V_{CQ}/(\Omega_C \cdot C) \text{ and } I_{41,Q}=V_{CI}/(\Omega_C \cdot C)$$

wherein C is the capacitive value of the two capacitive filter components $C_I$ and $C_Q$, respectively, and wherein $\Omega_C$ is the desired center frequency of the bandpass filter.

Figure 3B:
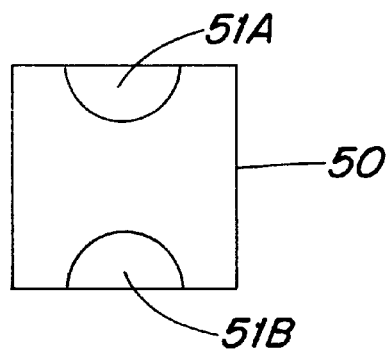
FIG. 3B illustrates a replacement representation of the coupling schedule of FIG. 3A.

In the following, a combination of two current source couplings connected in anti-parallel will be indicated with the phrase "gyrator", and will be indicated by the symbol 50 shown in FIG. 3B. A gyrator 50 has two terminals 51A and 51B. For coupling from 51A to 51B, the gyrator 50 comprises a first current source coupling not shown in FIG. 3B, of which terminal 51A is a voltage input and of which terminal 51B is a current output. For coupling from 51B to 51A, the gyrator 50 comprises a second current source coupling not shown in FIG. 3B, of which terminal 51B is a voltage input and of which terminal 51A is a current output. The two current source couplings each have a proportionality factor $G_{AB}$ and $G_{BA}$, respectively, defined as output current divided by input voltage. When both proportionality factors are equal to each other, or at least have an identical characteristic, the gyrator will be indicated as a symmetrical gyrator. This can be achieved if both current source couplings are identical, but this is not necessary.

Figure 4:
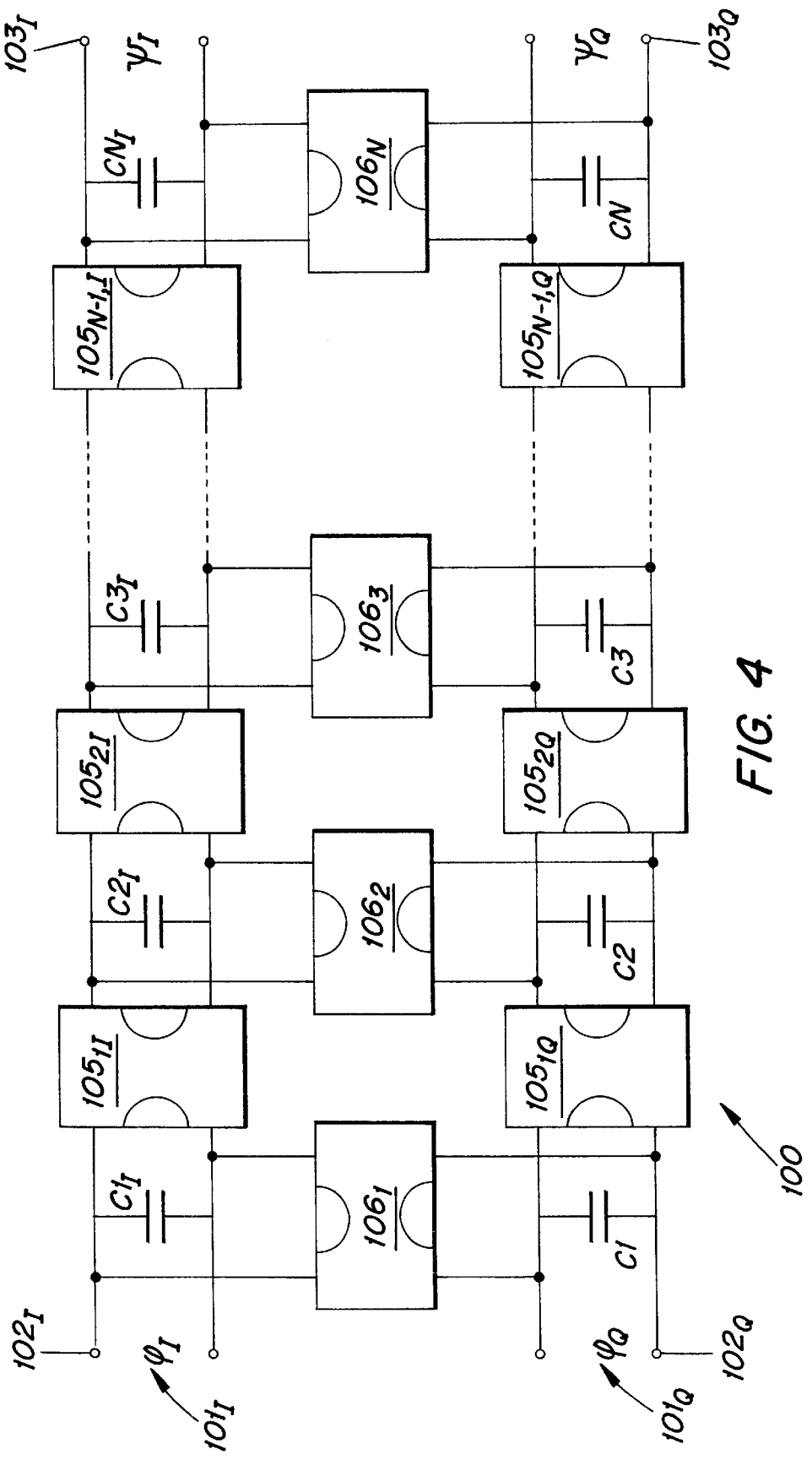
FIG. 4 is a basic schedule of an embodiment of a polyphase filter according to the present invention.

FIG. 4 shows an example of an implementation of a polyphase filter 100 according to the present invention. The polyphase filter 100 comprises an inphase channel $101_I$ and a quadrature channel $101_Q$, which are mutually substantially identical. The channels $101_I$, $101_Q$ have inputs $102_I$, $102_Q$ for receiving an inphase input signal $\phi_I$ and a quadrature input signal $\phi_Q$, respectively. The channels $101_I$, $101_Q$ further have outputs $103_I$, $103_Q$ for outputting an inphase output signal $\psi_I$ and a quadrature output signal $\psi_Q$, respectively. The inputs $102_I$, $102_Q$ are current inputs, i.e. the input signals $\phi_I$ and $\phi_Q$ are current signals; if it is desired that the filter 100 receives voltage signals, voltage-to-current converters can be switched before the inputs $102_I$, $102_Q$; since known per se voltage-to-current converters can be used for this, they will not be described in more detail here. The outputs $103_I$, $103_Q$ are voltage outputs, i.e. the output signals $\psi_I$ and $\psi_Q$ are voltage signals; when it is desired that the filter 100 outputs current signals, voltage-to-current converters can be switched after the outputs $103_I$, $103_Q$; since known per se voltage-to-current converters can be used for this, these will also not be described in more detail here.

The channels $101_I$, $101_Q$ comprise a plurality of N capacities $C1_I$, $C2_I$, $C3_I$, . . . $CN_I$ and $C1_Q$, $C2_Q$, $C3_Q$, . . . $CN_Q$, respectively, wherein $N \geq 2$.

In the inphase channel $101_I$, two subsequent capacities $Ci_I$ and $C[i+1]_I$ are always coupled by a gyrator $105i_I$. Similarly, in the quadrature channel $101_Q$, two subsequent capacities $Ci_Q$ and $C[i+1]_Q$ are always coupled by a gyrator $105i_Q$. The corresponding gyrators $105i_I$ and $105i_Q$ are mutually identical; herein, the "forward" proportionality factor G(i→i+1) and the "backwards" proportionality factor G(i+1→i) need not be mutually identical.

The corresponding capacities $Ci_I$ and $Ci_Q$ always have mutually identical capacity values Ci; for different values of i, the capacity values Ci can be different. The corresponding capacities $Ci_I$ and $Ci_Q$ are always coupled to each other by a symmetrical gyrator $106i$; the proportionality factors $Gi_{IQ}$ and $Gi_{QI}$ of each gyrator $106i$ are always equal to $1/(\Omega_c \cdot Ci)$.

Thus, the present invention provides a polyphase filter 20; 100 with to filter channels $30_I$, $30_Q$; $101_I$, $101_Q$ for processing an I-input signal $\phi_I$ and a Q-input signal $\phi_Q$, respectively. The filter has at least two capacitive filter components $C_I$, $C_Q$; $Ci_I$, $Ci_Q$ corresponding to each other in the two filter channels $30_I$, $30_Q$; $101_I$, $101_Q$, wherein the capacity values C; Ci of these two capacitive filter components $C_I$, $C_Q$; $Ci_I$, $Ci_Q$ are substantially equal to each other. Said two capacitive filter components $C_I$, $C_Q$; $Ci_I$, $Ci_Q$ are coupled to each other by means of two current source couplings $40_{QI}$, $40_{IQ}$; $106i$ with substantially equal characteristic, switched antiparallel. Hereby, a displacement of the filter characteristic over a distance $\Omega_c$ toward higher frequencies is achieved.

It will be evident to a person skilled in the art that the scope of the present invention is not limited to the examples discussed in the above, but that several amendments and modifications thereof are possible without deviating from the scope of the invention as defined in the attached claims.

What is claimed is:

1. Polyphase filter comprising:
    a first filter channel with a desired filter characteristic, with an input for receiving an I-input signal ($\phi_I$) and an output for providing an I-output signal ($\psi_I$);
    a second filter channel, substantially identical to the first filter channel, with an input for receiving a Q-input signal ($\psi_Q$) which is shifted 90° with respect to the I-input signal ($\phi_I$), and an output for providing a Q-output signal ($\phi_Q$) which is shifted 90° with respect to the I-output signal ($\psi_I$);
    said filter having at least one capacitive filter component ($C_I$; $Ci_I$) in the first filter channel and a capacitive filter component ($C_Q$; $Ci_Q$) corresponding therewith in the second filter channel, wherein capacity values (C; Ci) of these two capacitive filter components ($C_I$, $C_Q$; $Ci_I$, $Ci_Q$) are substantially equal to each other;
    wherein said two capacitive filter components ($C_I$, $C_Q$; $Ci_I$, $Ci_Q$) are coupled to each other by means of two current source couplings with substantially equal characteristic connected in anti-parallel.

2. Filter according to claim 1, wherein each current source coupling comprises a voltage-controlled current source with a voltage input and a current output, wherein the current output is coupled in parallel with the capacitive filter component ($C_I$, $C_Q$) of the one filter channel while the voltage input is coupled in parallel to the corresponding capacitive filter component ($C_Q$, $C_I$) of the other channel.

3. Filter according to claim 1, wherein a first current source coupling of the two current source couplings comprises:
    a first voltage detector having an input that is switched in parallel with said corresponding capacitive filter component ($C_Q$) in the second filter channel;
    a first voltage-controlled current source which is switched in parallel with said capacitive filter component ($C_I$) in the first filter channel, and which is controlled by an output signal of the first voltage detector;
    wherein a second current source coupling of the two current source couplings comprises:
    a second voltage detector having an input that is switched in parallel with said capacitive filter component ($C_I$) in the first filter channel;
    a second voltage-controlled current source which is switched in parallel with said corresponding capacitive filter component ($C_Q$) in the second filter channel, and which is controlled by an output signal of the second voltage detector;
    and wherein each current source is adapted to provide a current ($I_{41,I}$, $I_{41,Q}$) of which the current magnitude fulfills $$I_{41,I} = V_{CQ}/(\Omega_C \cdot C) \text{ respectively } I_{41,Q} = V_{CI}/(\Omega_C \cdot C)$$

where $V_{CQ}$ is a voltage detected by the first voltage detector, $V_{CI}$ is a voltage detected by the second voltage detector, and $\Omega_C$ is a center frequency of the desired filter characteristic.

4. Filter according to claim 1, wherein each filter channel comprises at least one combination of two capacities ($Ci_I$ and $C_I$, $Ci_Q$ and $C_Q$) which are coupled to each other by a gyrator.

5. Filter according to claim 4, wherein of said combination of two capacities, the first capacity ($Ci_I$) of the first filter channel and the first capacity ($Ci_Q$) of the second filter channel corresponding therewith, as well as the second capacity ($C_I$) of the first filter channel and the second capacity ($C_Q$) of the second filter channel corresponding therewith, are mutually coupled to each other by means of always a symetrical gyrator of which the proportionality factors ($Gi_{IQ}$ and $Gi_{QI}$, $G_{IQ}$, and $G_{QI}$) are always equal to $1/(\Omega_C \cdot Ci)$ and $1/(\Omega_C \cdot C)$, respectively.

6. Filter according to claim 1, wherein each of said first and second filter channels has a plurality of capacitive filter components, and wherein each of said filter components in the first filter channel is coupled, by means of two current source couplings switched anti-parallel, to the capacitive filter component ($C_Q$, $Ci_Q$) corresponding therewith in the second filter channel.

7. Filter according to claim 1, wherein each of said first and second filter channels has a lowpass filter characteristic, and wherein the polyphase filter has a bandpass filter characteristic caused by said current source couplings.

* * * * *